United States Patent
Ohtsuka et al.

[11] Patent Number: 6,159,854
[45] Date of Patent: Dec. 12, 2000

[54] PROCESS OF GROWING CONDUCTIVE LAYER FROM GAS PHASE

[75] Inventors: Nobuyuki Ohtsuka; Yasuo Matsumiya; Kuninori Kitahara, all of Kawasaki, Japan

[73] Assignee: Fujitsu Limited, Kawasaki, Japan

[21] Appl. No.: 08/455,520

[22] Filed: May 31, 1995

[30] Foreign Application Priority Data

Aug. 22, 1994 [JP] Japan ..................................... 6-196378
Dec. 27, 1994 [JP] Japan ..................................... 6-336980

[51] Int. Cl.$^7$ ................................................... H01L 21/44
[52] U.S. Cl. ........................... 438/681; 438/687; 438/688; 438/780
[58] Field of Search ............................ 437/192; 438/138, 438/139, 303, 305, 586, 595, 681, 687, 688, 780

[56] References Cited

U.S. PATENT DOCUMENTS

| | | | |
|---|---|---|---|
| 4,956,204 | 9/1990 | Amazawa et al. | 427/248.1 |
| 5,180,687 | 1/1993 | Mikoshiba et al. | 438/675 |
| 5,188,975 | 2/1993 | Kojima et al. | 437/48 |
| 5,217,756 | 6/1993 | Shinzawa | 438/674 |
| 5,316,972 | 5/1994 | Mikoshiba et al. | 438/674 |
| 5,545,591 | 8/1996 | Sugai et al. | 437/192 |
| 5,572,072 | 11/1996 | Lee | 257/751 |
| 5,599,741 | 2/1997 | Matsumoto et al. | 437/192 |

OTHER PUBLICATIONS

D.M. Speckman et al., "Influence of Flow Dynamics on the Morphology of CVD Aluminum Thin Films", Mat. Res. Soc. Symp. Proc., vol. 334, pp 283–288.

K. Tsubouchi et al., "Complete–planarization . . . ", Appl. Phys. Lett. 57(12), 1990, pp. 1221–1223.

N. Takeyasu et al., "Characterization . . . ", Extended Abstracts of the 1993 Int. Conf. Solid State Devices and Materials, pp. 180–182.

*Primary Examiner*—David Nelms
*Assistant Examiner*—Reneé R Berry
*Attorney, Agent, or Firm*—Armstrong, Westerman, Hattori, McLeland & Naughton

[57] ABSTRACT

A process of growing a conductive layer on a substrate by a chemical reaction of a source gas on the substrate includes preparing a substrate having an area covered with a coating layer of a material different from a material of the substrate and an area not covered with the coating layer; supplying a first source gas onto the substrate and causing a chemical reaction of the first source gas to occur on the substrate only in the area not covered with the coating layer, thereby selectively growing a first conductive layer on the substrate only in the area not covered with the coating layer; terminating the supplying of the first source gas; and supplying a second source gas onto the substrate and causing a chemical reaction of the second source gas to occur on both of the first conductive layer and the coating layer, thereby unselective growing a second conductive layer of the same conductive material as the first conductive layer, on both of the first conductive layer and the coating layer. A chemical vapor deposition process for growing a conductive layer, includes maintaining, in a container, an amount of a source liquid containing at least one of constituent elements of the conductive layer; introducing the source liquid from the container and a heated carrier gas into a vaporizer vaporizing the source liquid by heating to generate a source gas in the vaporizer; and supplying from the vaporizer the source gas together with the heated carrier gas immediately into a reactor for chemical vapor deposition.

19 Claims, 12 Drawing Sheets

PROCESS OF GROWING CONDUCTIVE LAYER FROM GAS PHASE

BACKGROUND OF THE INVENTION

1. Field of the Invention

The present invention relates to a process of growing a conductive layer from a gas phase, particularly to a process of growing a thin film of conductive material such as the wiring and electrodes of semiconductor devices.

2. Description of the Related Art

To advance the refinement of the semiconductor device structure and to provide increased speed and integration, it becomes more and more necessary to establish a technology of forming highly reliable submicron wiring and electrodes.

In the conventional technology, wiring layers of LSIs formed on a Si substrate are typically formed of sputtered Al. The sputtering process, however, has poor step coverage such that disconnection of conductive layers occurs at the side wall or bottom of openings for electric contact, or via-holes, extending through an insulating layer, or that via-holes are incompletely buried or filled with conductive material and unfilled pores remain in the via-holes, degrading the flatness of the conductive layer, and other layers, lying over the insulating layer.

FIG. 1 schematically illustrates a fine via-hole 133 formed through an $SiO_2$ layer 132 on a Si or metal substrate 131 and buried with a conductive layer 134, typically on Al, by sputtering. The midthickness line drawn of the conductive layer 134 represents a temporary surface profile of the conductive layer 134 during its growth process.

As shown in FIG. 1, it is unavoidable that sputtering occasionally fails to completely fill the fine via-hole 133 and leaves an unfilled core or pore 135. This is particularly the case when a conductive layer is formed in a via-hole having a large aspect ratio, or a depth-to-diameter ratio, which is necessary to achieve an advanced integration of semiconductor devices.

A proposed solution to the above-mentioned drawback in the sputtering process is to bury a via-hole with a CVD-conductive layer having good step coverage. For this purpose, CVD-Al is most preferred because it has the lowest resistivity among various materials used to form a conductive layer and is therefore practically utilized in a selective growth process on a substrate having top surface areas of different materials.

K. Tsubouchi et al., in Appl. Phys. Lett., 57(12), pp. 1221–1223, proposed a selective CVD process. FIGS. 2A to 2D are cross-sectional views showing typical sequential steps of this process to form conductive layers. The reference numeral 51 denotes an Si substrate, 52 an $SiO_2$ layer, 53 a via-hole, and 54, 55, 56 Al conductive layers.

Step 1 (FIG. 2A)

An $SiO_2$ insulating layer 52 is formed on a Si substrate 51 typically by thermal oxidation and is subjected to a photolithography processing to open a via-hole 53 extending therethrough to the top surface of the underlying Si substrate 51.

Step 2 (FIG. 2B)

A CVD process is performed by using a source gas of dimethylalumiumhalide (hereinafter abbreviated as DMAH defined by the formula: $AlH(CH_3)_2$), which has the nature of selectivity to selectively grow an Al layer only on the Si substrate 51, and not on the $SiO_2$ layer 52, i.e., an Al layer 54 is grown only on the surface of the Si substrate 51 exposed at the bottom of the via-hole 53 extending through the $SiO_2$ layer 52.

Step 3 (FIG. 2C)

The Al layer 54 is grown to a sufficient thickness to completely bury or fill the via-hole 53, so that the top surfaces of the $SiO_2$ layer 52 and the completed Al layer 54 are in substantially the same plane. A plasma is then generated to electrostatically charge the top surface of the $SiO_2$ layer 52, thereby facilitating decomposition of the DMAH gas so that a thin Al layer 55 is grown on the $SiO_2$ layer 52 as well as on the preexistent Al layer 54 formed in the via-hole 53.

Step 4 (FIG. 2D)

A further Al layer 56 is subsequently grown on the thin Al layer 55 lying over the Al layer 54 and the $SiO_2$ layer 52, to form a continuous conductor or wiring layer consisting of the Al layers 54, 55, and 56, which extends from the top surface of the Si substrate 51 (i.e., the bottom of the via-hole 53) to the top surface of the $SiO_2$ layer 52, which is in substantially the same plane as the top end of the via-hole 53.

Because the selective CVD process realizes selective growth of the Al layer 54 only in the via-hole 53 by using an Al-source gas having a selectivity to the substrate, it is necessary to use a plasma in order to unselectively grow the Al layer 55 on both of the different substrates of the prior Al layer 54 and the $SiO_2$ layer 52 simultaneously.

This process thus requires that a CVD growth apparatus be equipped with a plasma generator, which unavoidably complicates the apparatus design.

N. Takeyasu et al., in "Extended Abstracts of the 1993 International Conference on Solid State Device and Materials", pp. 180–182, proposed an alternative growth process, in which the CVD selective growth is first performed to bury a via-hole extending through an insulating layer with Al, and a sputtering process is then utilized to effect unselective growth, to achieve the complete burying of via-holes and form a flat conductive layer lying over the via-hole and the insulating layer. This process, however, not only further raises the apparatus cost but also complicates the process steps mainly due to inclusion of the wafer transfer between CVD and sputtering apparatuses.

It is true that the CVD process provides good step coverage in or over fine via-holes or realizes selective growth of a conductive layer on a substrate having top surface areas of different materials, but it has a drawback of a slow growth rate of 0.1 $\mu$m/min or less, which is at least by one order slower than the growth rate of 1.0 $\mu$m/min obtained by the sputtering process and not only results in a small throughput but also necessitates an elongated time of heating a substrate to provide a desired thickness, during which time undesirable chemical reactions between the conductive layer and the underlying layer proceed and vary the material nature of these layers or substantial variation occurs in the concentration of any impurity diffused in a semiconductor substrate in the preceding process steps.

Therefore, it would be most desirable from the viewpoints of the throughput or productivity and of the apparatus cost if selective and unselective growth processes could be effected using a CVD process alone.

SUMMARY OF THE INVENTION

An object of the present invention is to provide a process of growing a conductor layer completely filling a fine via-hole and acceptable as wiring or electrodes of semiconductor devices having submicron device patterns including such via-holes.

Another object of the present invention is to provide a CVD process of growing a conductor layer at an improved growth rate by using an increased source gas supply rate.

To achieve the first object according to the first aspect of the present invention, there is provided a process of growing a conductive layer on a substrate by a chemical reaction of a source gas on the substrate, the process comprising the steps of:

preparing a substrate having an area covered with a coating layer of a material different from a material of the substrate and an area not covered with the coating layer;

supplying a first source gas onto the substrate and causing a chemical reaction of the first source gas to occur on the substrate only in the area not covered with the coating layer, thereby selectively growing a first conductive layer on the substrate only in the area not covered with the coating layer;

terminating the supplying of the first source gas; and supplying a second source gas on to the substrate and causing a chemical reaction of the second source gas to occur on both of the first conductive layer and the coating layer, thereby unselectively growing a second conductive layer of the same conductive material as the first conductive layer, on both of the first conductive layer and the coating layer.

Preferably, the steps of growing the first conductive layer and the unselective growth are performed by chemical vapor deposition.

Typically, the coating layer consists of an insulating material or a dielectric material and the substrate is a semiconductor substrate.

Preferably, a third conductive layer is formed on at least part of the substrate and the area not covered with the coating layer includes at least part of the third conductive layer. Preferably, a wiring layer consisting of the third conductive layer and a diffusion barrier layer lying over the third conductive layer are formed on at least part of the substrate and the area not covered with the coating material includes at least part of the wiring layer.

Also preferably, the second source gas comprises a hydride of the major component element of the conductive material composing both the first conductive layer and the second conductive layer. More preferably, the conductive material consists of Al or an Al-based alloy. The Al-based alloy may contain at least one element selected from the group consisting of transition metals, group-I elements such as Cu, group-III elements other than Al, group-IV elements such as Ti, Hf, and Si, and combinations thereof.

In a preferred embodiment of the present invention, the second source gas consists of $AlH_3$ or an $AlH_3$-containing compound, more preferably the $AlH_3$-containing compound consists of $AlH_3$—NR where R is any one of alkyl groups, most preferably the alkyl group R is $(CH_3)_2(C_2H_5)$ or $(CH_3)_3$.

In a preferred embodiment of the present invention, the first source gas consists of $AlH(CH_3)_2$.

The substrate is preferably held at a temperature of from 200 to 350° C. in the steps of growing the first conductive layer and the second conductive layer. More preferably, the substrate is held at a first temperature in the step of growing the first conductive layer and at a second temperature different from the first temperature in the step of growing the second conductive layer. Most preferably, the second temperature is lower than the first temperature.

According to the first aspect of the present invention, there is also provided a chemical vapor deposition process for growing a thin film of Al or an Al-based alloy on an insulating substrate, the process comprising chemical vapor deposition using an Al-source gas consisting of $AlH_3$—NR where R is any one of alkyl groups.

To achieve the second object according to the second aspect of the present invention, there is provided a chemical vapor deposition process for growing a conductive layer, the process comprising the steps of:

maintaining, in a container, an amount of a source liquid containing at least one of constituent elements of the conductive layer;

introducing the source liquid from the container and a heated carrier gas into a vaporizer;

vaporizing the source liquid by heating to generate a source gas in the vaporizer; and supplying from the vaporizer the source gas together with the heated carrier gas immediately into a reactor for chemical vapor deposition, thereby forming a conductive layer on a substrate.

In a preferred embodiment, the substrate has an area covered with a coating layer of a material different from a material of the substrate and has an area not covered with the coating layer and wherein the source gas is supplied onto the substrate in the reactor to cause a chemical reaction of the source gas to occur on the substrate only in the area not covered with the coating layer, thereby selectively growing a conductive layer on the substrate only in the area not covered with the coating layer. More preferably, the conductive layer consists of Al or an Al-based alloy. The Al-based alloy may contain at least one element selected from the group consisting of transition metals, group-I elements such as Cu, group-III elements other than Al, group-IV elements such as Ti, Hf, and Si, and combinations thereof.

Preferably, the source liquid consists of dimethylaluminiumhydride (DMAH) formulated as $AlH(CH_3)_2$.

Also preferably, the source liquid consists of $AlH_3$—NR where R is any one of alkyl groups.

Alternatively, the source liquid consists of dimethylethylaminealane (DMEAA) formulated as $AlH_3N(CH_3)_2(C_2H_5)$ having the alkyl group R of $(CH_3)_2(C_2H_5)$.

The source liquid may consist of $Al(C_4H_9)_3$.

At least one element of the Al-based alloy may be added to the liquid source before being supplied to the reactor.

According to a preferred embodiment of the combined first and second aspects of the present invention, there is provided a chemical vapor deposition process for growing a conductive layer, the process comprising the steps of:

preparing a substrate having an area covered with a coating layer of a material different from a material of the substrate and an area not covered with the coating layer;

placing the substrate in a reactor for chemical vapor deposition;

maintaining, in a first container, an amount of a first source liquid containing a major constituent element of a material of a first conductive layer;

maintaining, in a second container, an amount of a second source liquid containing the same major constituent element as the material of the first conductive layer;

introducing the first source liquid from the first container and a heated carrier gas into a first vaporizer;

introducing the second source liquid from the second container and a heated carrier gas into a second vaporizer;

vaporizing the first source liquid by heating to generate a first source gas in the first vaporizer;

vaporizing the second source liquid by heating to generate a second source gas in the second vaporizer;

supplying from the first vaporizer the first source gas together with the heated carrier gas immediately into the reactor, thereby selectively growing a first conductive layer on the substrate only in the area not covered with the coating layer;

terminating the supplying of the first source gas; and supplying from the second vaporizer the second source gas together with the heated carrier gas immediately into the reactor, thereby unselectively growing a second conductive layer of the same conductive material as the first conductive layer, on both of the first conductive layer and the coating layer.

Preferably, the first source liquid is liquefied dimethylaluminumhydride (DMAH) and the second source liquid is liquefied dimethylethylaminealane (DMEAA) so as to grow the first conductive layer and the second conductive layer both of Al.

DESCRIPTION OF THE PREFERRED EMBODIMENT

Figure 1:
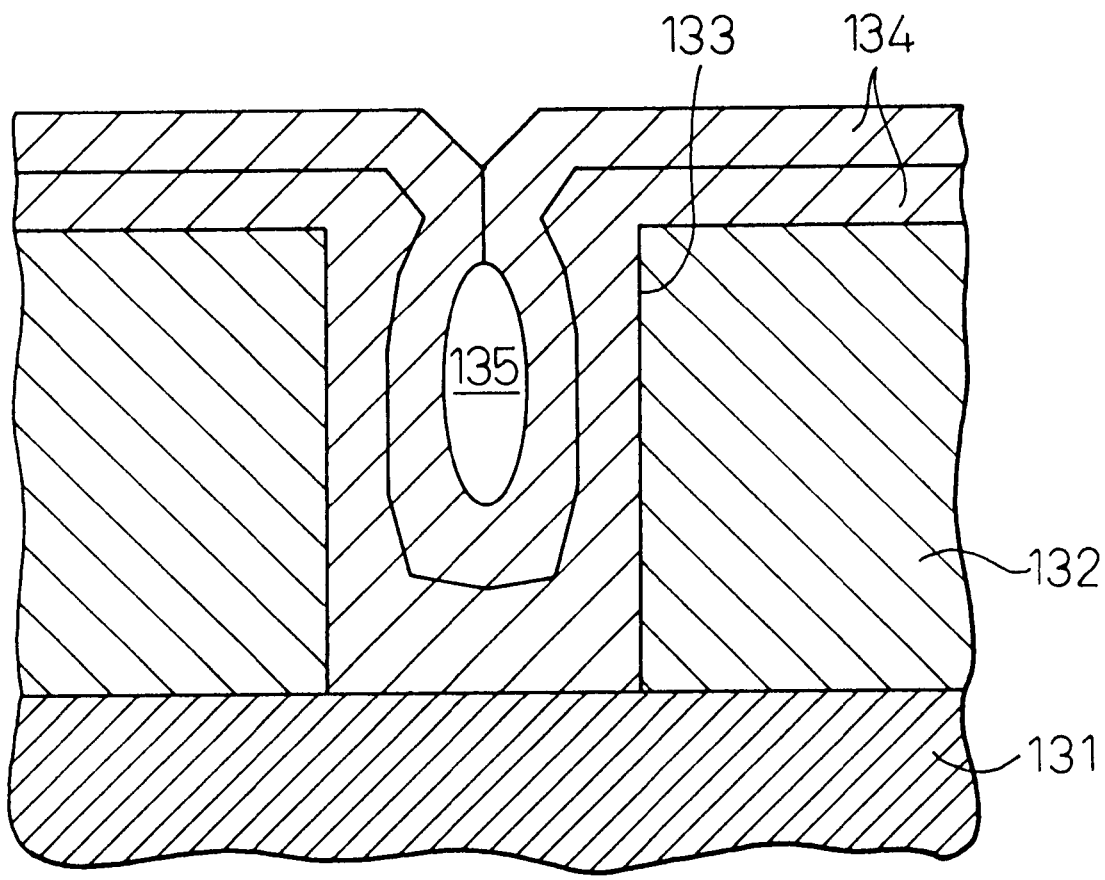
FIG. 1 schematically illustrates an unfilled pore left in a fine via-hole when buried by the conventional process using sputtering.
Figure 2A:
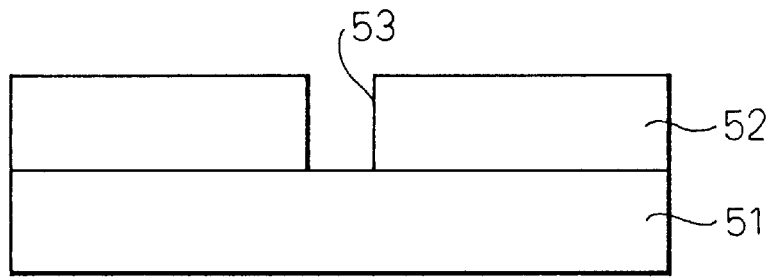
FIGS. 2A to 2D are cross-sectional views showing a typical sequential steps of the conventional CVD process using plasma.
Figure 2B:
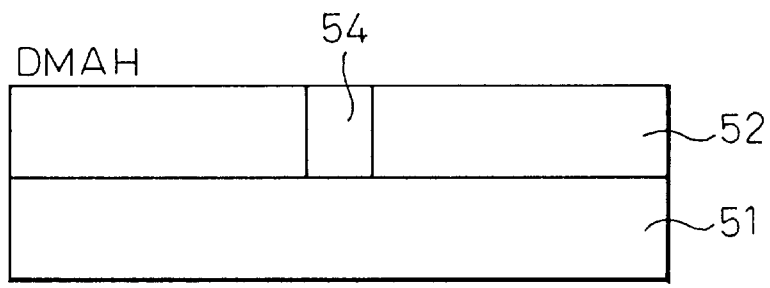
Figure 2C:
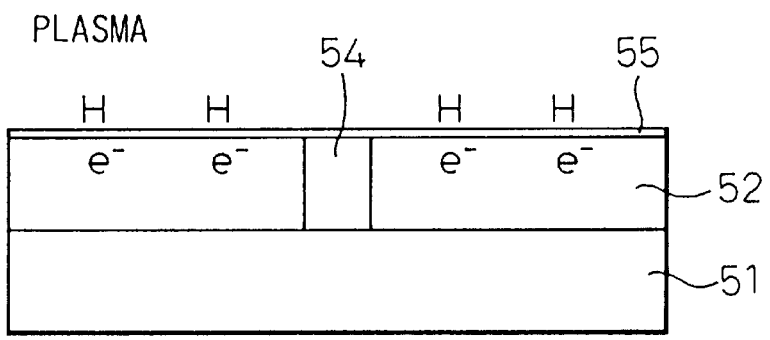
Figure 2D:
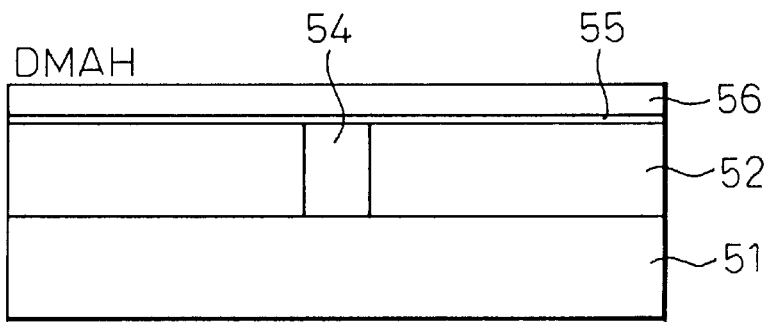

In a selective growth process, different source gases having different mechanisms of decomposition on, and adhesion to, a substrate are supplied onto a substrate having areas made of different materials having different chemical properties so that the areas of the substrate can be coated with layers of different materials of desired kinds, respectively.

The source gases are vaporized compounds, such as metal organic compounds, containing the component elements of the layers to be coated or grown on a substrate.

The difference in decomposition of sources is produced by the difference in the bonding principle or bonding energy of the compounds or the intermediate products derived therefrom. The difference in adhesion is caused by the difference in the interaction between the source gases and the substrate to be coated.

It should be noted that the decomposition and the adhesion of a compound are not necessarily independent from each other but both are determined by the bonding principle or bonding energy of the compound.

The basic principle of the present invention in the first aspect can be advantageously applied to a case in which a via-hole for electrical contact is opened through an insulating layer and the underlying Si substrate is thus exposed. In the first selective growth phase, a layer of a metal M is first grown only on the Si substrate exposed in the via-hole, by supplying onto the substrate a source compound MA having a chemical structure decomposable with the aid of a catalytic reaction of hydrogen atoms adhered to the exposed Si substrate. In the second unselective growth phase, another layer of the same metal M is then grown not only on the grown M layer in the via-hole but also on the insulating layer, by supplying another source compound MB having a chemical structure easily decomposable even in the absence of hydrogen atoms or free carriers.

In a preferred embodiment according to the first aspect of the present invention, an Al layer is grown on an Si substrate having a patterned $SiO_2$ layer in a conventional CVD reactor by using an Al source of dimethylaluminiumhydride (DMAH) for the selective growth and another Al source of dimethylethylaminealane (DMEAA) for the unselective growth, as will be described in detail later.

DMAH has a selective nature or selectivity between Si and $SiO_2$ and makes it possible to bury the via-hole only. After the via-hole is buried or filled up with Al, the source gas supply is switched from DMAH to DMEAA to grow another Al layer to cover the entire surface including the previously grown Al layer in the via-hole and the insulating layer.

The second unselective growth is achieved in a manner such that, because of weak Al—N bond in DMEAA, the Al from DMEAA is adhered to the surface of the $SiO_2$ layer to form $AlH_3$, which then immediately decomposes again because of weak Al—H bond and forms an Al layer on the $SiO_2$ layer. The Al layer, once formed, can grow subsequently.

In the first selective growth phase, because of strong Al—C bond in DMAH, any DMAH molecule adhered to the $SiO_2$ surface is desorbed therefrom and no substantial growth of an Al layer occurs on the $SiO_2$ layer.

It is reported, in Mat. Res. Soc. Symp. Proc. vol. 334, 1994 Materials Research Society, pp. 283–288, that an Al layer is grown on an $SiO_2$ layer by using a source gas of trimethylaminealane (TMAA: $((CH_3)_3N)AlH_3$). The TMAA, however, is in solid state under normal temperature and has a vapor pressure of about: 2 torr at 25° C., and therefore, is difficult to supply in a vaporized form.

According to the first aspect of the present invention, a preferred Al source consists of dimethylethylaminealane (DMEAA: $((CH_3)_2(C_2H_5)N)AlH_3$), which is in liquid state under normal temperature, can be easily supplied by carrier gas bubbling at a well-controlled supply rate to continue a stable reaction for a long time.

The first aspect of the present invention will be described in further detail by way of the following Examples 1 to 6.

EXAMPLE 1

An Al layer was grown on an $SiO_2$ layer according to the first aspect of the present invention.

Figure 3A:
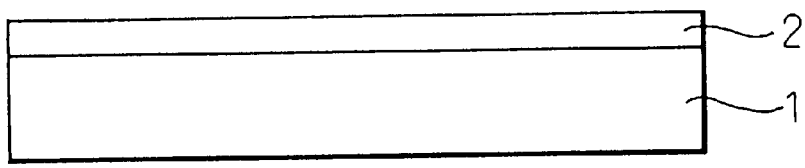
FIGS. 3A and 3B are cross-sectional views showing the process steps of growing an Al layer on an $SiO_2$ layer, according to the present invention.
Figure 3B:
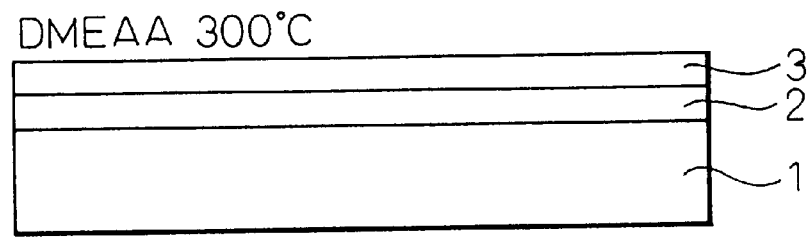

FIGS. 3A and 3B are cross-sectional views showing the process steps to grow a thin Al layer.

Step 1 (FIG. 3A)

An $SiO_2$ layer 2 was first grown on an Si substrate 1.

Step 2 (FIG. 3B)

An Al layer 3 was grown on the $SiO_2$ layer 2 in a low pressure MOCVD reactor using a source gas of DMEAA.

Figure 4:
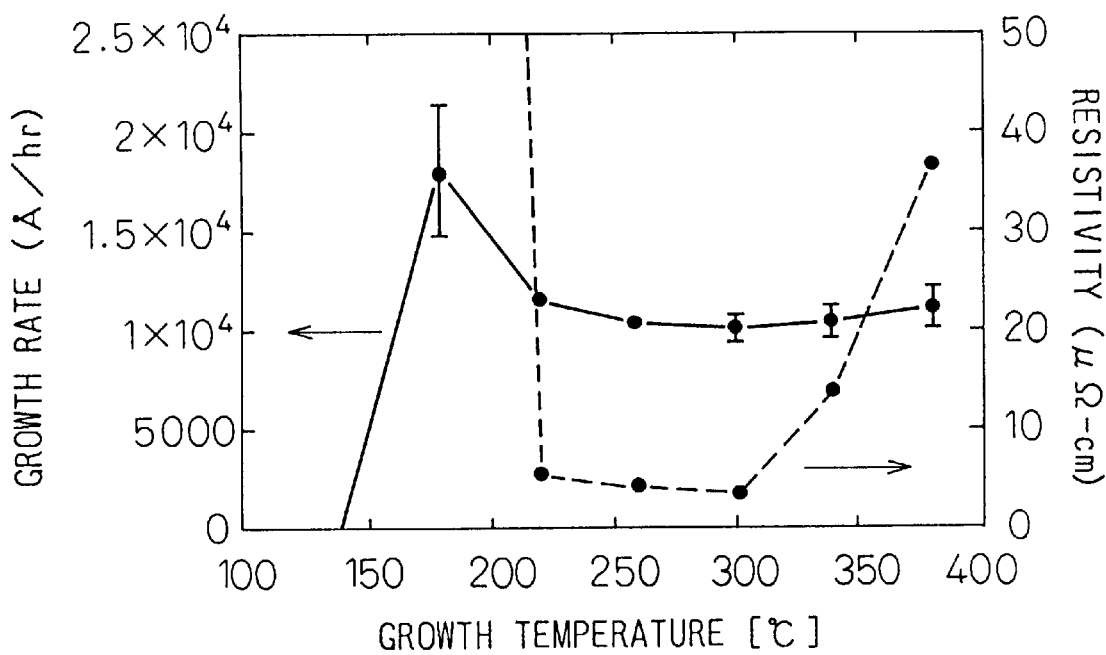
FIG. 4 is a graph showing the growth rate and the resistivity of Al layers as functions of the growth temperature in the process according to the present invention.

The data concerning the thus-grown Al layer are plotted in FIG. 4 in terms of the growth rate (Å/hr, left ordinate) and the resistivity ($\mu\Omega$-cm, right ordinate) as a function of the growth temperature (in ° C., abscissa). The bubbler for DMEAA was held at 20° C., the pressure in the MOCVD reactor was maintained at 270 Pa, and $H_2$ was used as the carrier gas.

Although the Al layer began to grow at a growth temperature of about 140° C., the density of the generated Al nucleus on the $SiO_2$ layer was so small that the resulting Al layer did not form a continuous film but formed dispersed aggregates of fine flat crystals of Al, providing an extremely high resistivity above the limit of measurement.

When the growth temperature was 200° C. or higher, a continuous Al film was obtained.

A growth temperature of 300° C. resulted in an Al layer having the lowest resistivity of 3.4 $\mu\Omega$-cm.

At higher growth temperatures, the produced Al layers had coarse grains, which degraded the surface flatness and raised the resistivity.

The combined results of the growth rate and the resistivity show that, when DMEAA is used as a source gas, an acceptably good Al layer is grown on an $SiO_2$ layer at a growth temperature of from 200 to 350° C.

EXAMPLE 2

This Example demonstrates the optional use of annealing to improve the quality of Al layers grown at different growth temperatures on an $SiO_2$ layer formed on an Si substrate.

Figure 5A:
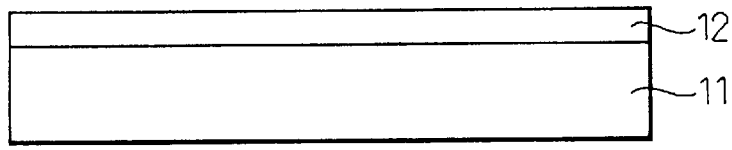
FIGS. 5A to 5C are cross-sectional views showing the two step growth of an Al layer on an $SiO_2$ layer, according to the present invention.

Step 1 (FIG. 5A)

An $SiO_2$ layer 12 was formed on an Si substrate 11.

Figure 5B:
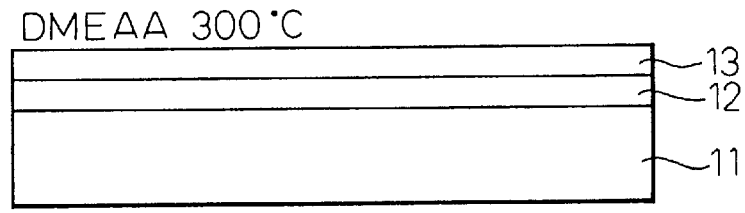

Step 2 (FIG. 5B)

The first Al layer 13 was grown on the $SiO_2$ layer 12 by using DMEAA as the source gas at a growth temperature of 300° C. for a growth time of 10 min.

Figure 5C:
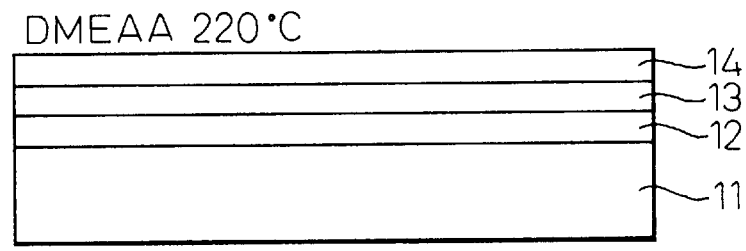

Step 3 (FIG. 5C)

The growth temperature was lowered to 220° C. to grow the second Al layer 14 for a growth time of 50 min.

The thus-grown first and second Al layers 13 and 14 had a resistivity of 3.3 $\mu\Omega$-cm in the as-grown condition.

To improve the Al layer quality, the growth temperature was changed for the following reason.

An Al layer grown at a low growth temperature such as 200° C. has fine grains to provide a flat surface but has a high resistivity because the grains are not joined together.

In contrast, higher growth temperatures provide an increased density of the growth nucleus and the produced Al film has grains joined together to somewhat reduce the resistivity, but the grains are coarse to degrade the surface flatness of the film.

By combining these facts, a higher growth temperature is first used to grow a film having grains joined together to provide a low resistivity, and then, a lower growth temperature is used to subsequently grow another film having good surface flatness on the first film, so as to form an Al layer having both good flatness and a low resistivity.

The thus-obtained Al layer was then annealed in an $H_2$ atmosphere at 520° C. for 10 min. The annealed Al layer had a further reduced resistivity of 3.1 $\mu\Omega$-cm.

The reduction in the resistivity is considered to occur because grain growth and a rearrangement in the crystal orientation occurred during the annealing.

EXAMPLE 3

This Example demonstrates the production of a continuous Al wiring layer through a via-hole opened through an $SiO_2$ layer formed on an Si substrate.

Figure 6A:
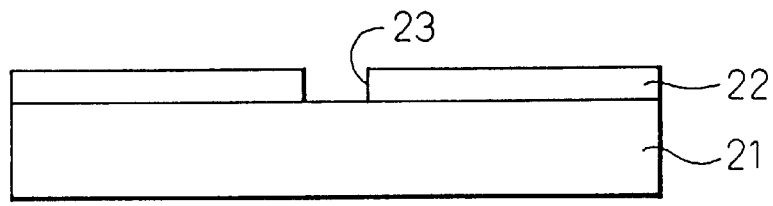
FIGS. 6A to 6C are cross-sectional views showing the process steps of selectively growing an Al layer only on the exposed Si substrate in a via-hole opened through an $SiO_2$ insulating layer and then unselectively growing another Al layer both on the prior Al layer and the $SiO_2$ layer, according to the present invention.

Step 1 (FIG. 6A)

An $SiO_2$ layer 22 was formed on an Si substrate 21 and a via-hole 23 was then opened through the $SiO_2$ layer 22.

Figure 6B:
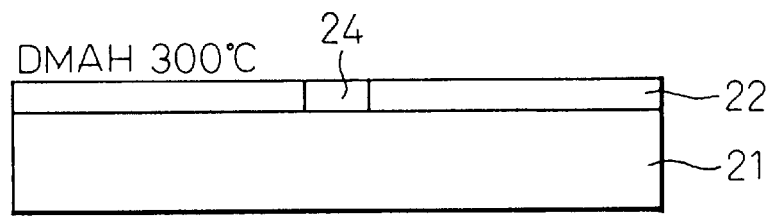

Step 2 (FIG. 6B)

A first Al layer 24 was selectively grown only on the exposed Si substrate 21 in the via-hole 23 in a low pressure MOCVD reactor by using a source gas of DMAH having high selectivity to substrate. The same growth behavior was observed as shown in FIG. 4.

Figure 6C:
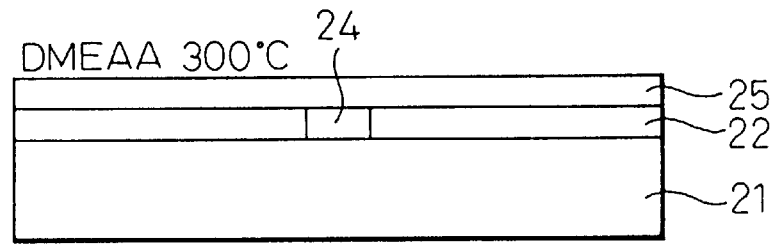

Step 3 (FIG. 6C)

When the via-hole 23 was completely buried with the first Al layer 24, the source gas was switched from DMAH to DMEAA having no substantial selectivity to substrate, to unselectively grow a second Al layer 25 both on the $SiO_2$ layer 22 and the first Al layer 24.

The combined use of the selective DMAH and the unselective DMEAA makes it possible to produce a wiring layer having a flat, continuous top surface and composed of a flat upper portion 25 extending over the $SiO_2$ insulating layer 22 and a downward extruding portion 24 completely filling the via-hole 23 for ensuring electric contact across the $SiO_2$ insulating layer 22.

The following conditions were used in this Example.

Growth temperature: 300° C.

Growth pressure: 270 Pa.

Bubbler temperature: 20° C. both for DMAS and DMEAA.

Substrate: Si (100) n-type.

$SiO_2$ via-hole: 0.3 $\mu$m in diameter and 0.5 $\mu$m in depth.

EXAMPLE 4

This Example demonstrates the production of a continuous Al wiring layer through a via-hole opened through an $SiO_2$ layer formed on a TiN layer coated on a lower Al layer.

Figure 7A:
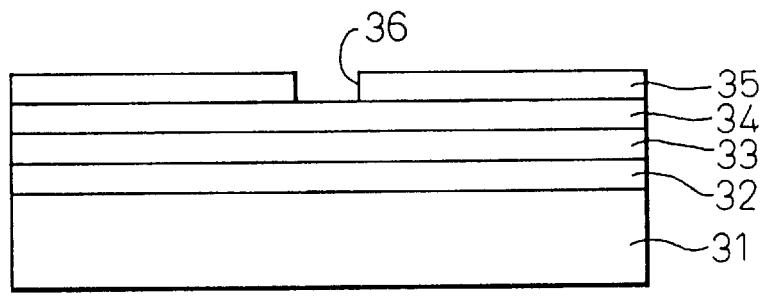
FIGS. 7A to 7C are cross-sectional views showing the process steps of selectively growing an Al layer only on the exposed TiN barrier layer in a via-hole opened through an $SiO_2$ insulating layer and then unselectively growing another Al layer both on the prior Al layer and the $SiO_2$ layer, according to the present invention.

Step 1 (FIG. 7A)

An $SiO_2$ insulating layer 32, a lower wiring composed of an Al layer 33 having a top coating of TiN barrier layer 34, and an $SiO_2$ layer 35 were formed in that order on an Si substrate 31. A via-hole 36 was then opened through the $SiO_2$ insulating layer 35.

Figure 7B:
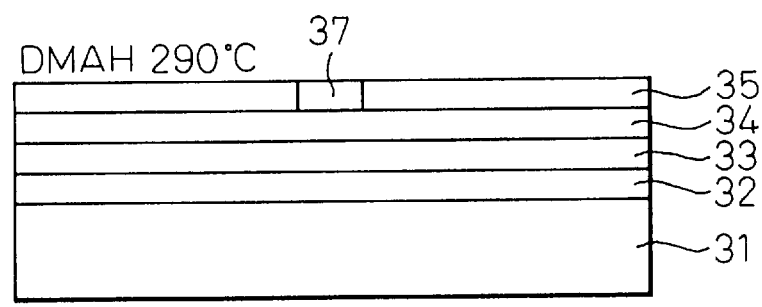

Step 2 (FIG. 7B)

A first Al layer 37 was selectively grown only on the exposed TiN barrier layer 34 at the bottom of the via-hole 36 in an MOCVD reactor by using a source gas of DMAH having high selectivity to substrate. The same growth behavior was observed as shown in FIG. 4.

Figure 7C:
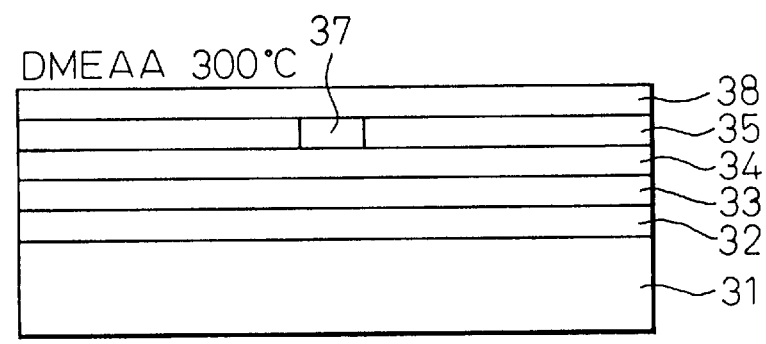

Step 3 (FIG. 7C)

When the via-hole 36 was completely buried with the first Al layer 37, the source gas was switched from DMAH to DMEAA having no substantial selectivity to substrate, to unselectively grow a second Al layer 38 on both the $SiO_2$ layer 35 and the first Al layer 37.

The combined use of the selective DMAH and the unselective DMEAA made it possible to produce a wiring layer having a flat, continuous top surface and composed of a flat upper portion, or the second Al layer 38, extending over the $SiO_2$ insulating layer 35 and a downward extruding portion, or the first Al layer 37, completely filling the via-hole 36 to provide electric contact across the $SiO_2$ insulating layer 35 between the upper wiring or the second Al layer 38 and the lower wiring composed of the lower Al layer 33 having the top coating of TiN barrier layer 34.

The following conditions were used in this Example.

Growth temperature: 290° C.

Growth pressure: 700 Pa.

Bubbler temperature: 20° C. both for DMAH and DMEAA.

Substrate: Si (100) n-type.

$SiO_2$ via-hole: 0.6 $\mu$m in diameter and 1.0 $\mu$m in depth.

EXAMPLE 5

This Example demonstrates the production of a continuous Al wiring layer through a via-hole opened through an $SiO_2$ layer formed on a lower Al layer.

Figure 8A:
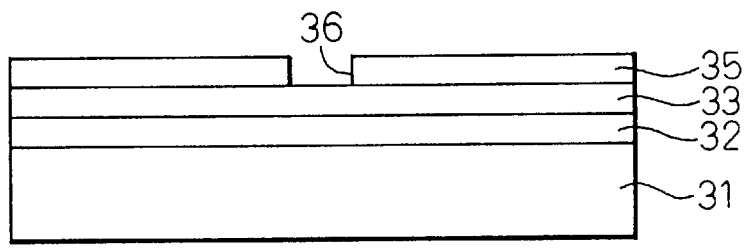
FIGS. 8A to 8C are cross-sectional views showing the process steps of selectively growing an Al layer only on the exposed lower Al layer in a via-hole opened through an $SiO_2$ insulating layer and then unselectively growing another Al layer both on the prior Al layer and the $SiO_2$ layer, according to the present invention.

Step 1 (FIG. 8A)

An $SiO_2$ insulating layer 32, a lower wiring composed of an Al layer 33, and an $SiO_2$ layer 35 were formed in that order on an Si substrate 31. A via-hole 36 was then opened through the $SiO_2$ insulating layer 35.

Figure 8B:
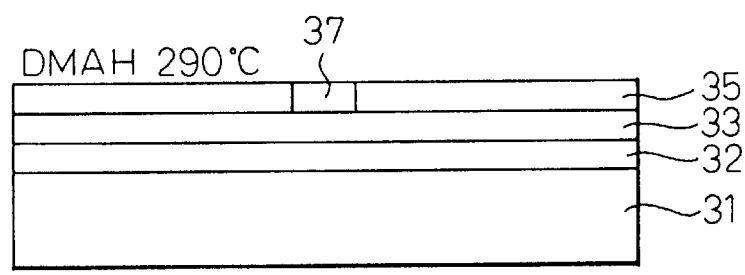

Step 2 (FIG. 8B)

A first Al layer 37 was selectively grown only on the exposed lower Al layer 33 at the bottom of the via-hole 36 in a low pressure MOCVD reactor by using a source gas of DMAH having high selectivity to substrate. The same growth behavior was observed as shown in FIG. 4.

Figure 8C:
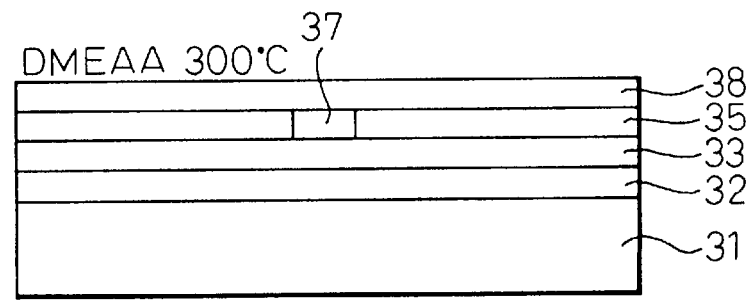

Step 3 (FIG. 8C)

When the via-hole 36 was completely buried with the first Al layer 37, the source gas was switched from DMAH to DMEAA having no substantial selectivity to substrate, to unselectively grow a second Al layer 38 both on the $SiO_2$ layer 35 and the first Al layer 37.

The combined use of the selective DMAH and the unselective DMEAA makes it possible to produce a wiring layer having a flat, continuous top surface and composed of a flat upper portion, or the second Al layer 38, extending over the $SiO_2$ insulating layer 35 and a downward extruding portion, or the first Al layer 37, completely filling the via-hole 36 to provide electric contact across the $SiO_2$ insulating layer 35 between the upper wiring or the second Al layers 38 and the lower wiring composed of the lower Al layer 33.

The following conditions were used in this Example.

Growth temperature: 290° C.

Growth pressure: 700 Pa.

Bubbler temperature: 20° C. both for DMAH and DMEAA.

Substrate: Si (100) n-type.

$SiO_2$ via-hole: 0.6 $\mu$m in diameter and 1.0 $\mu$m in depth.

EXAMPLE 6

This Example demonstrates a process of growing a continuous Al—Cu alloy wiring layer through a via-hole opened through an $SiO_2$ layer formed on an Si substrate.

Figure 9A:
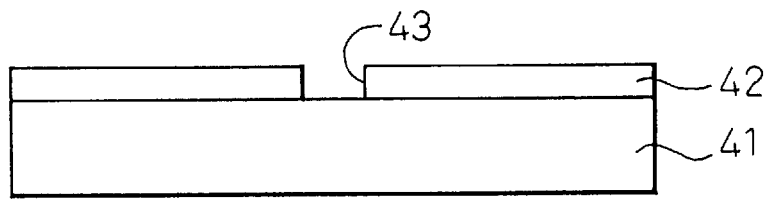
FIGS. 9A to 9C are cross-sectional views showing the process steps of selectively growing an Al—Cu alloy layer only on the exposed Si substrate in a via-hole opened through an $SiO_2$ insulating layer and then unselectively growing another Al—Cu alloy layer both on the prior Al—Cu alloy layer and the $SiO_2$ layer.

Step 1 (FIG. 9A)

An $SiO_2$ layer 42 was formed on an Si substrate 41 and a via-hole 43 was then opened through the $SiO_2$ layer 42.

Figure 9B:
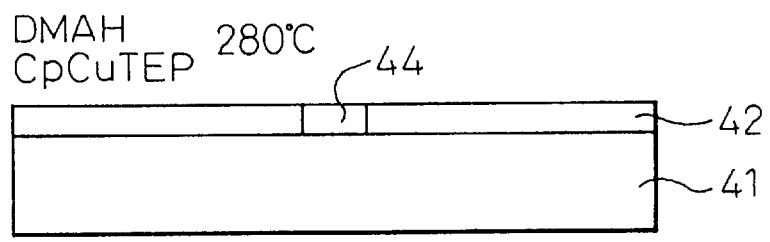

Step 2 (FIG. 9B)

A first Al—Cu alloy layer 44 was selectively grown only on the exposed Si substrate 41 at the bottom of the via-hole 43 in a low pressure MOCVD reactor by using an Al-source gas of DMAH and a Cu-source gas of cyclopentadienyl-copper-triethylphosphin (CpCuTEP). Because the Al—Cu alloy contained Cu in an amount as small as about 1%, substantially the same growth behavior was observed as shown in FIG. 4.

Figure 9C:
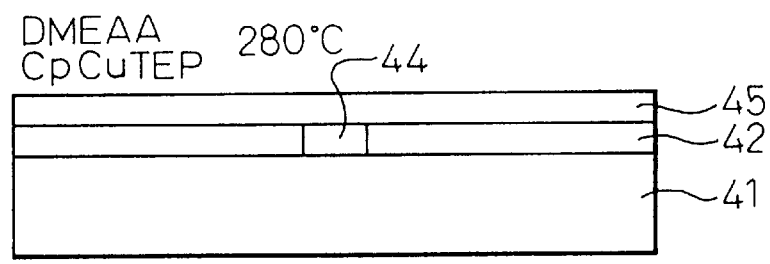

Step 3 (FIG. 9C)

When the via-hole 43 was completely buried with the first Al—Cu layer 44, the Al-source gas was switched from DMAH to DMEAA having no substantial substrate-selectivity, while maintaining the use of the Cu-source gas of CpCuTEP unchanged, to unselectively grow a second Al—Cu alloy layer 45 both on the $SiO_2$ layer 42 and the first Al—Cu layer 44.

The combined use of the selective DMAH and the unselective DMEAA as Al sources makes it possible to produce an Al—Cu wiring layer having a flat, continuous top surface and composed of a flat upper portion, or the second Al—Cu layer 45, extending over the $SiO_2$ insulating layer 42 and a downward extruding portion 44 completely filling the via-hole 43 to provide electric contact across the $SiO_2$ insulating layer 42.

The inclusion of about 1% of Cu in Al imparts a improved resistance to stress migration.

The following conditions were used in this Example.

Growth temperature: 280° C.

Growth pressure: 10000 Pa.

Bubbler temperature: 20° C. for DMAH, 20° C. for DMEAA, and 50° C. for CpCuTEP.

Substrate: Si (100) n-type.

$SiO_2$ via-hole: 0.5 $\mu$m in diameter and 1.0 $\mu$m in depth.

A glass plate, a silica plate, or other substrates may be used in place of the Si substrate used in the above-described Examples.

Although an Al—Cu alloy was described in the above Example, the conductor or wiring layer according to the present invention may be made of other Al-based alloys containing a small amount of one or more elements selected from the group consisting of transition metals, the group III elements other than Al, the group IV elements, such as Ti, Co, Ni, Si, Y, Ga, In, Hf, V, Ge, W, and Pd, and combinations thereof.

According to the first aspect, the present invention provides a process in which selective and unselective growths of conductor layers are performed only by switching selective and unselective source gases in a single reactor such as a CVD reactor, and thereby reduces the production cost of high speed, refined ULSIs involving submicron wirings and via-contacts.

In the second aspect, the present invention provides a CVD process of growing a conductor layer at an improved growth rate by using an increased supply rate of source gas.

Conventionally, the CVD-Al growth rate is controlled by the source gas supply rate, and therefore, could be raised if the source gas supply could be increased, in principle. However, this cannot practically be achieved with the conventional source supply effected by carrier gas bubbling, because the supply rate of metal source to the CVD reactor is limited by the vapor pressure of source material and the temperature of container vessel, or bubbler, for the source material.

Although it would be possible to increase the source supply rate by raising the bubbler temperature, the piping from the bubbler to the reactor must be heated at a higher temperature in order to prevent the source gas generated in the bubbler from being condensed back to the liquid state. This is dangerous because the materials usually used as sources of Al or other metals are combustible and may cause explosions at elevated temperatures.

To solve such a conventional problem according to the second aspect of the present invention, the source material is supplied in the liquid condition and is vaporized to form a source gas, which is then immediately introduced into a CVD reactor.

Figure 10:
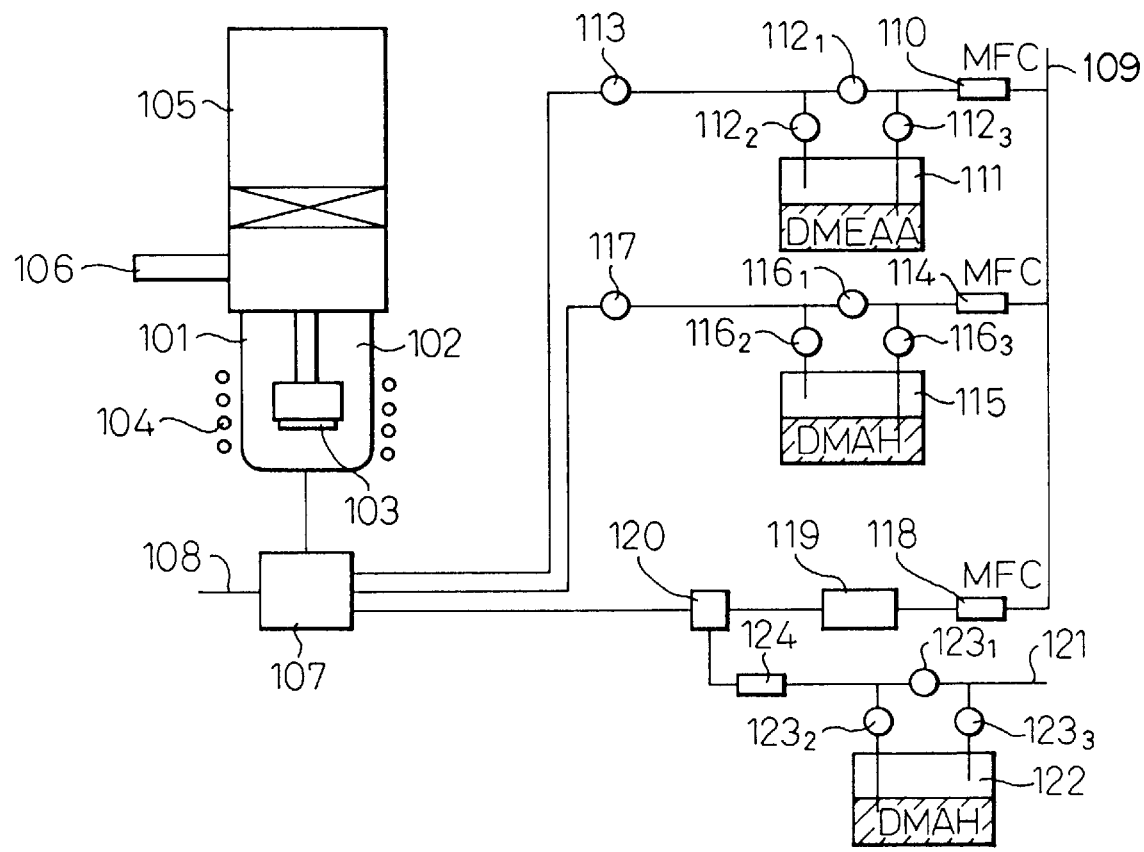
FIG. 10 illustrates an arrangement of an MOCVD apparatus according to the present invention.

FIG. 10 illustrates the arrangement of an apparatus for carrying out the CVD process according to the second aspect of the present invention. The arrangement includes a CVD reactor 101, a susceptor 102, a substrate 103, a radio frequency (RF) coil 104, a load lock 105, an evacuating pump 106, a gas-switching valve 107, a vent 108, a hydrogen supply line 109, gas mass flow controllers 110, 114, and 118, a bubbler 111 for DMEAA, flow control valves $112_1$, $112_2$, $112_3$, $116_1$, $116_2$, $116_3$, $123_1$, $123_2$, and $123_3$, pressure regulating valves 113 and 117, a bubbler 115 for DMAH, a heat exchanger 119, a vaporizer 120, a pressurized-helium supply line 121, a DMAH container vessel 122, and a liquid mass flow controller 124.

It will be easily recognized by person Skilled in the art that the illustrated apparatus can be also used for carrying out the conventional CVD process as well as the process of the present invention.

The CVD reactor 101 of the apparatus contains the susceptor 102 for holding the substrate 103. The susceptor 102 is induction-heated by the RF coil 104 provided outside and surrounding the reactor 101 and the temperature of the substrate 103 is monitored at all times.

The CVD reactor 101 has a load lock 105 which opens and closes the reactor 101 against the environmental air when the substrate 103 is mounted on and removed from the susceptor 102 or when the inside of the reactor 101 is cleaned. The CVD reactor 101 also has an evacuating pump 106. The source gases are selected through the gas-switching valve 107 before being introduced into the reactor 101. The vent 108 discharges any excessive amount of source gas or a purging gas.

The apparatus has a first source supply system for supplying DMEAA to the CVD reactor 101 via the gas-switching valve 107, the system including a hydrogen supply line 109, a gas mass flow controller 110, and flow control valves $112_1$, $112_2$, and $112_3$, a bubbler 111 for DMEAA, and a pressure regulating valve 113.

The first source supply system is entirely purged off with hydrogen gas by opening the flow control valve $112_1$, closing the flow control valves $112_2$ and $112_3$, switching the gas-switching valve 107 to the side of the vent 108, and supplying the hydrogen gas through the hydrogen supply line 109. The first source supply system supplies a DMEAA vapor from the DMEAA bubbler 111 at a regulated pressure through the pressure regulating valve 113, by closing the flow control valve $112_1$, opening the flow control valves $112_2$ and $112_3$, switching the gas-switching valve 107 to the CVD reactor 101, and supplying hydrogen gas at a controlled rate through the gas mass flow controller 110.

The apparatus also has a second source supply system for supplying DMAH to the CVD reactor via the gas-switching valve 107, the system including a hydrogen supply line 109, a gas mass flow controller 114, a flow control valves $116_1$, $116_2$, and $116_3$, a DMAH bubbler 115, and a pressure regulating valve 117.

The second source supply system is entirely purged off with hydrogen gas by opening the flow control valve $116_1$, closing the flow control valves $116_2$ and $116_3$, switching the gas-switching valve 107 to the side of the vent 108, and supplying the hydrogen gas through the hydrogen supply line 109. The first source supply system supplies a DMAH vapor from the DMAH bubbler 115 at a regulated pressure through the pressure regulating valve 117, by closing the flow control valve $116_1$, opening the flow control valves $116_2$ and $116_3$, switching the gas-switching valve 107 to the CVD reactor 101, and supplying hydrogen gas at a controlled rate through the gas mass flow controller 114.

According to the second aspect of the present invention, the apparatus further has a third source supply system for supplying DMAH to the CVD reactor 101 via the gas-switching valve 107, the third system including the hydrogen supply line 109, the gas mass flow controller 118, the heat exchanger 119, the vaporizer 120, a pressurized helium supply line 121, a liquid DMAH container vessel 122, and a liquid mass flow controller 124.

The third supply system supplies DMAH to the reactor 101 by closing the flow control valve $123_1$, opening the flow control valves $123_2$ and $123_3$, switching the gas-switching valve 107 to the reactor 101, introducing the liquid DMAH from the container 122 into the vaporizer 120 at a controlled rate through the liquid mass flow controller 124 by means of the pressurized helium gas supplied through the line 121, vaporizing the liquid DMAH by heating in the vaporizer 120 to form a DMAH gas while mixing it with a hydrogen gas supplied through the line 109 and heated by the heat exchanger 119, and supplying the thus-generated DMAH gas from the vaporizer 120 together with the heated hydrogen gas immediately into the CVD reactor 101 via the gas-switching valve 107.

The third source supply line according to the second aspect of the present invention supplies a source material in the liquid state from the container 122 to the vaporizer 120 at a controlled flow rate through the liquid mass flow controller 124, vaporizes the liquid to form a source gas in the vaporizer 120, and supplies the source gas from the vaporizer 120 immediately to the CVD reactor 101. The source gas is generated by heating in the vaporizer 120, and therefore, can have a high concentration, which provides an increased source gas supply rate and thereby results in an increased growth rate. The heating is performed substantially only in a vaporizer having a relatively small volume and causes almost no danger to explosion. The piping from the vaporizer to the CVD reactor can be as short as possible, although it must be heated so as to prevent the source gas from being condensed back to the liquid during transfer therethrough. There is no necessity to heat other pipings or valves.

This source supply method of the present invention has been found to provide an increased growth rate as high as about 1.0 $\mu$m/min, which is at least by one order greater than that achieved by the conventional CVD growth process. The layer grown by using this supply method also has an improved morphology in comparison with those grown by the conventional CVD process.

It has been also found that a conductive layer of Al or other metal or metal alloy can be selectively grown at a high growth rate on an Si or other substrate partially coated with an $SiO_2$ or other insulating or dielectric layer.

The second aspect of the present invention will be described in further detail by way of the following Examples 7 to 11.

EXAMPLE 7

An Al layer was grown on an Si substrate in the MOCVD apparatus shown in FIG. 10 by the process according to the second aspect of the present invention.

For comparison, another Al layer was grown in the same CVD apparatus by the conventional process.

The growth data for both runs are summarized below.

Inventive Process
  Liquid DMAH container temperature: 20° C.
  DMAH supply rate: 0.1 g/min
  Growth temperature: 300° C.
  Growth rate: 1.2 μm/cm Conventional Process
  DMAH bubbler temperature: 20° C.
  DMAH supply rate: 0.8 μg/min (450 sccm)
  Growth temperature: 300° C.
  Growth rate: 0.0083 μm/min Comparison between these two sets of data shows that the present invention realized a DMAH supply rate $1.25 \times 10^5$ times greater and a growth rate 136 times greater than those obtained by the conventional process, where (0.1 g/min)/(0.8 μg/min)≈$1.25 \times 10^5$ and (1.2 μm/min)/(0.0083 μm/min) ≈136.

EXAMPLE 8

Figure 11:
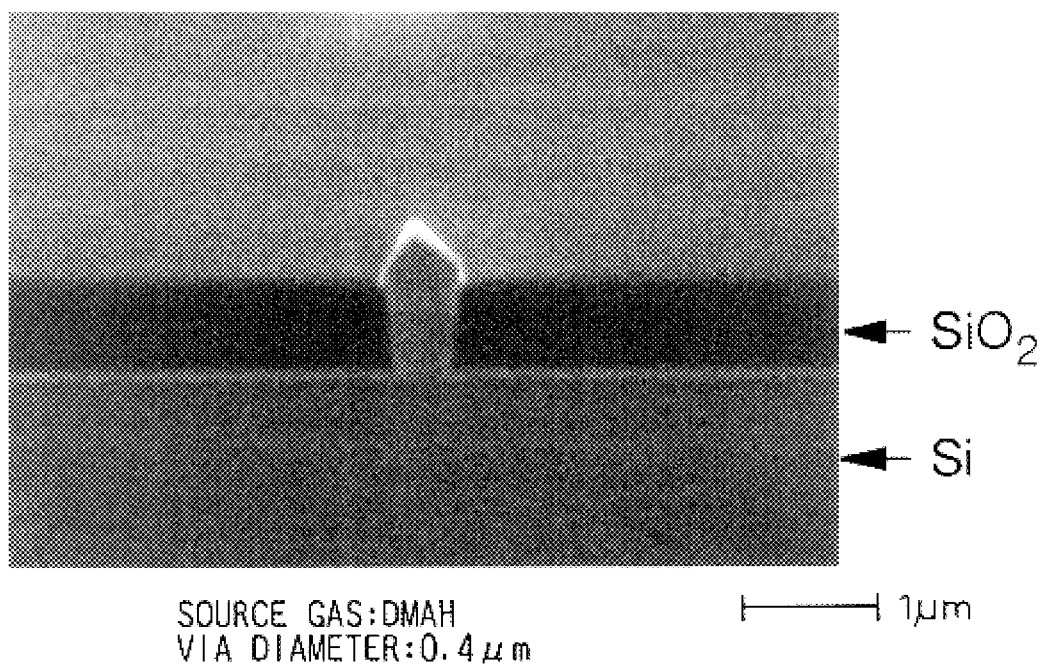
FIG. 11 is a photomicrograph of a fine via-hole completely filled up with an Al layer grown by the process according to the present invention.

An Al layer was selectively grown on an Si substrate only in a 0.5 μm via-hole open through an $SiO_2$ insulating layer formed on the Si substrate in the MOCVD apparatus shown in FIG. 10 under the same conditions as in Example 7 according to the present invention The fine via-hole was completely buried with the thus-grown Al layer as can be seen from FIG. 11 showing a photomicrograph of the cross section of this sample across the via-hole. It is also noted that it took less than 1 min to bury up the via-hole.

EXAMPLE 9

An Al layer was grown on an $SiO_2$ layer in the MOCVD apparatus shown in FIG. 10 according to the present invention.

First, an Al layer was grown on an $SiO_2$ Layer at a growth temperature of 300° C. by the conventional CVD process using a source gas of DMEAA bubbled at 20° C. The source gas was then switched to DMAH to perform the CVD process of the present invention at a growth temperature of 220° C. An Al layer having a resistivity of 3.1 μΩ-cm was obtained.

For comparison, only the conventional CVD process was used until the Al layer grew to the final thickness, not switching the source gas. An Al layer having a resistivity of 3.4 μΩ-cm was obtained.

EXAMPLE 10

The MOCVD apparatus shown in FIG. 10 was used to perform the selective and unselective growths of Al layers on Si and/or $SiO_2$ to bury a via-hole and provide a flat Al layer over the $SiO_2$ layer according to the present invention.

An $SiO_2$ layer was formed on an Si substrate and a via-hole was then opened through the $SiO_2$ layer. An Al layer was selectively grown only on the exposed Si substrate in the via-hole by the conventional CVD process using an Al-source of a DMAH gas generated by bubbling of a liquid DMAH.

When the via-hole was completely buried with the Al layer, the Al-source was switched to a DMEAA gas generated by vaporization of liquid DMEAA in the vaporizer 120 supplied from the liquid DMEAA container 122 according to the present invention, to unselectively grow a further Al layer both on the $SiO_2$ layer and on the prior Al layer already grown in the via-hole.

The combined use of DMAH having a high selectivity but providing a small growth rate DMEAA having a low selectivity but providing a large growth rate makes it possible to completely bury the via-hole and to produce a flat Al layer over the $SiO_2$ layer in a shortened time period.

EXAMPLE 11

An Al layer was grown on an $SiO_2$ layer formed on an Si substrate in the MOCVD apparatus shown in FIG. 10 by using DMEAA having substantially no selectivity, specifically by introducing the liquid DMEAA from the container vessel 122 into the vaporizer 120, vaporizing the liquid DMEAA in the vaporizer 120, and supplying the thus-generated DMEAA gas to the MOCVD reactor 101, according to the present invention.

For comparison, an Al layer was grown in the same manner as the above, except that the source DMEAA gas was supplied from the bubbler 111 as used in the conventional CVD process.

Figure 12A:
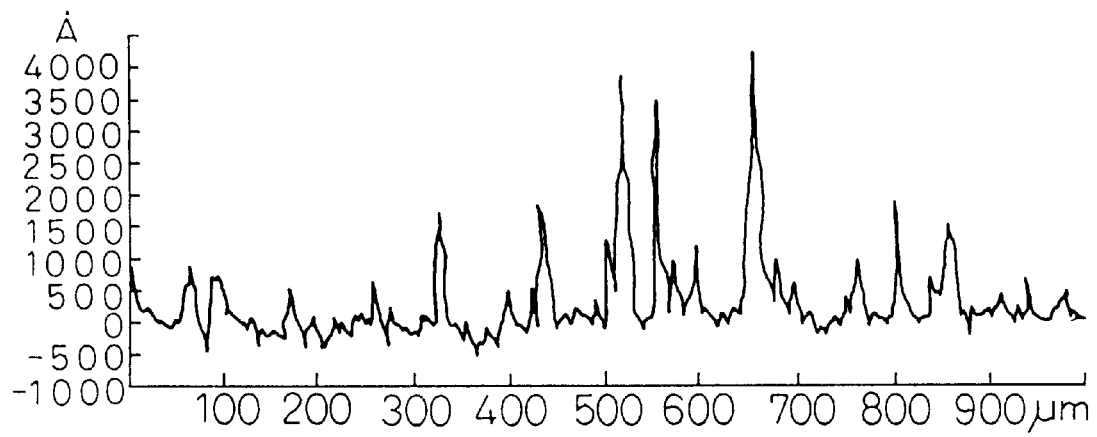
FIGS. 12A and 12B are graphs showing the surface roughness for Al layers grown by the conventional process and the inventive process, respectively.
Figure 12B:
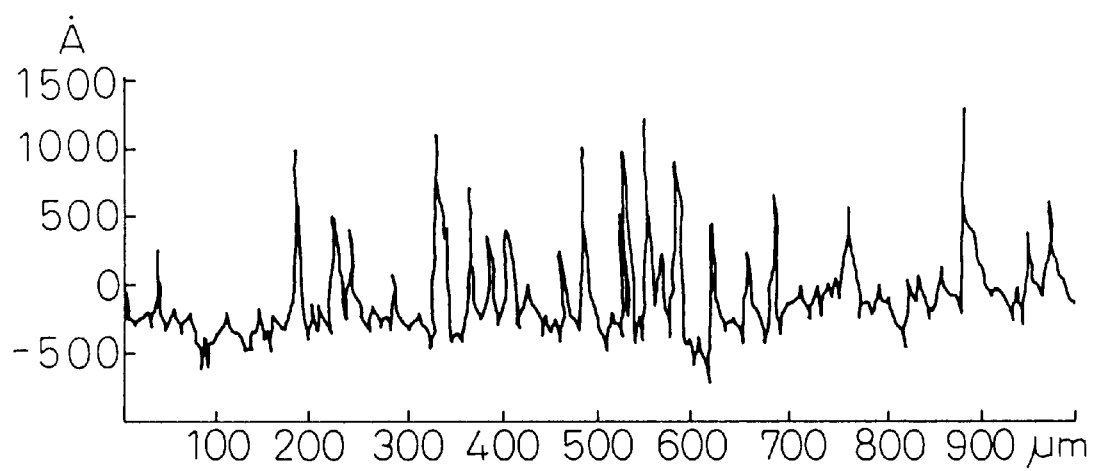

FIG. 12A and 12B show the surface flatness for the Al layer grown by the conventional process and the Al layer grown by the inventive process, respectively. It can be seen from these results that the Al layer (FIG. 12B) grown in this Example of the present invention had an extremely improved surface unevenness of 500 Å or less in comparison with the Al layer (FIG. 12A) grown by the conventional process and having a large surface unevenness of more than 4000 Å. The improvement in the surface flatness is considered because the reduced growth period suppressed random growth.

Although an Si substrate was used in the above-recited Examples, the substrate may be made of other materials such as other semiconductors, glasses, sapphires or other insulators, dielectric materials, with or without a surface coating.

The substrate may have electric circuit components formed therein and/or thereon, with or without wiring, electrodes or other conductor layers formed thereon.

The substrate may be a semiconductor substrate having an insulating layer formed thereon and including holes such as via-holes or contact holes opened through the insulating layer, in which holes wirings, electrodes, barrier metals or other conductor layers are exposed. In such a substrate, an upper wiring layer of Al or Al-based alloy can be grown to extend from the conductor layers to the top surface of the insulating layer, according to the present invention.

Al may be preferably alloyed with at least one element selected from the group consisting of Cu or other elements from group I, V, Co, Y, Ni or other transition metals, In, Ga, or other elements from group III (except for Al), Ti, Hf, Si or other elements from group IV, and the combinations thereof, in order to provide an Al-based conductor layer with desired properties including the mechanical strength, the electrical resistance, the corrosion resistance, the migration property, and the thermal expansion coefficient.

In the process according to the present invention, it is also possible that Al-source liquid is mixed with source liquids of these elements and the liquid mixture is used as the source liquid to grow a layer of an Al-based alloy containing desired alloying elements in desired proportions. This provides better controlled growth of an Al-base alloy layer than the conventional CVD process using bubbling to generate source gases.

The use of an Al-source of AlH(CH$_3$)$_2$, abbreviated as DMAH, realizes a high speed selective growth of an Al layer only on an Si substrate, but not on an SiO$_2$ layer.

The use of an Al-source of liquid AlH$_3$—NR, where R denotes an alkyl group, including diethylaminealane or the like realizes a high speed unselective growth of an Al layer both on an Al or other conductive layer and on an SiO$_2$ or other insulating layer. For this purpose, dimethylethylaminealane (DMEAA) having R of (CH$_3$)C$_2$H$_5$, or formulated as AlH$_3$—N(CH$_3$)C$_2$H$_5$, is most preferred.

It should be also noted that the Al sources having too a low vapor pressure to be used in the conventional CVD process, such as triisobuthylaluminum Al(C$_4$H$_9$)$_3$, can be practically used in the CVD process of the present invention in which such sources are supplied in the liquid state immediately before being introduced into a CVD reactor.

It is also possible that the source liquid is changed to another one during the growth of a layer of Al or a Al-based alloy, to perform either of selective and unselective growth, or to optimize the growth conditions with consideration on the economy of source material, the growth rate, etc.

What is claimed is:

1. A chemical vapor deposition process for growing a conductive layer, the process comprising the steps of:
    maintaining, in a container, an amount of a source liquid containing at least one of constituent elements of the conductive layer;
    introducing the source liquid from the container at a controlled flow rate and a heated carrier gas into a vaporizer;
    vaporizing the source liquid by heating to generate a source gas in the vaporizer; and
    supplying from the vaporizer the source gas together with the heated carrier gas immediately into a reactor for chemical vapor deposition, thereby forming a conductive layer on a substrate.

2. A chemical vapor deposition process according to claim 1, wherein the substrate has an area covered with a coating layer of a material different from a material of the substrate and has an area not covered with the coating layer and wherein the source gas is supplied onto the substrate in the reactor to cause a chemical reaction of the source gas to occur on the substrate only in the area not covered with the coating layer, thereby selectively growing a conductive layer on the substrate only in the area not covered with the coating layer.

3. A process according to claim 1, wherein the coating layer consists of an insulating material.

4. A process according to claim 1, wherein the coating layer consists of a dielectric material.

5. A process according to claim 1, wherein the substrate is a semiconductor substrate.

6. A process according to claim 5, wherein a third conductive layer is formed on at least part of the substrate and the area not covered with the coating layer includes at least part of the third conductive layer.

7. A process according to claim 5, wherein a wiring layer consisting of the third conductive layer and a diffusion barrier layer lying over the third conductive layer are formed on at least part of the substrate and the area not covered with the coating material includes at least part of the wiring layer.

8. A process according to claim 1, wherein the conductive layer consists of Al or an Al-based alloy.

9. A process according to claim 8, wherein the Al-based alloy contains at least one element selected from the group consisting of transition metals, group-I elements such as Cu, group-III elements other than Al, group-IV elements such as Ti, Hf, and Si, and combinations thereof.

10. A process according to claim 8 or 9, wherein the source liquid consists of dimethylaluminiumhydride (DMAH) formulated as AlH(CH$_3$)$_2$.

11. A process according to claim 8 or 9, wherein the source liquid consists of AlH$_3$—NR where R is any one of alkyl groups.

12. A process according to claim 11, wherein the source liquid consists of dimethylethylaminealane (DMEAA) formulated as AlH$_3$N(CH$_3$)$_2$(C$_2$H$_5$) having the alkyl group R of (CH$_3$)$_2$(C$_2$H$_5$).

13. A process according to claim 8 or 9, wherein the source liquid consists of Al(C$_4$H$_9$)$_3$.

14. A process according to claim 9, wherein said at least one element is added in the liquid source before being supplied to the reactor.

15. A process according to claim 1, wherein the substrate is held at a temperature of from 200 to 350° C. during the growing of the conductive layer.

16. A chemical vapor deposition process for growing a conductive layer, the process comprising the steps of:
    preparing a substrate having an area covered with a coating layer of a material different from a material of the substrate and an area not covered with the coating layer;
    placing the substrate in a reactor for chemical vapor deposition;
    maintaining, in a first container, an amount of a first source liquid containing a major constituent element of a material of a first conductive layer;
    maintaining, in a second container, an amount of a second source liquid containing the same major constituent element as the material of the first conductive layer;
    introducing the first source liquid from the first container at a controlled flow rate and a heated carrier gas into a first vaporizer;
    introducing the second source liquid from the second container at a controlled flow rate and a heated carrier gas into a second vaporizer;
    vaporizing the first source liquid by heating to generate a first source gas in the first vaporizer;
    vaporizing the second source liquid by heating to generate a second source gas in the second vaporizer;
    supplying from the first vaporizer the first source gas together with the heated carrier gas immediately into the reactor, thereby selectively growing a first conductive layer on the substrate only in the area not covered with the coating layer;
    terminating the supplying of the first source gas; and
    supplying from the second vaporizer the second source gas together with the heated carrier gas immediately into the reactor, thereby unselectively growing a second conductive layer of the same conductive material as the first conductive layer, on both of the first conductive layer and the coating layer.

17. A process according to claim 16, wherein the first source liquid is liquefied dimethylaluminiumhydride (DMAH) and the second source liquid is liquefied dimethylethylaminealane (DMEAA) so as to grow the first conductive layer and the second conductive layer both of Al.

18. A process according to claim 17, wherein the substrate is held at a temperature of from 200 to 350° C. during the steps of growing of the conductive layer and the second conductive layer.

19. A process according to claim 18, wherein the substrate is held at a first temperature in the step of growing the first conductive layer and at a second temperature lower than the first temperature in the step of growing the second conductive layer.

* * * * *